United States Patent [19]

Zylstra et al.

[11] Patent Number: 4,466,042
[45] Date of Patent: Aug. 14, 1984

[54] TRIP INDICATOR ASSEMBLY FOR ELECTRONIC CIRCUIT BREAKER

[75] Inventors: Henry J. Zylstra, Alburnette; Donald R. Venzke, Cedar Rapids, both of Iowa

[73] Assignee: Square D Company, Palatine, Ill.

[21] Appl. No.: 492,515

[22] Filed: May 9, 1983

[51] Int. Cl.³ .............................................. H02H 1/00
[52] U.S. Cl. .................................. 361/115; 340/664; 340/644; 340/815.29; 335/17; 335/170
[58] Field of Search ................ 361/115, 94, 95, 96, 361/97, 93, 206; 340/664, 659, 764, 644, 815.13, 815.29; 335/6, 17, 170, 174, 253

[56] References Cited
U.S. PATENT DOCUMENTS

| 3,253,098 | 5/1966 | Perry | 335/170 |
| 3,432,782 | 3/1969 | Ellenberger | 335/170 |
| 4,004,201 | 1/1977 | DePuy | 361/96 |
| 4,040,382 | 8/1977 | Sheppard | 340/815.29 X |
| 4,215,328 | 7/1980 | Chabot et al. | 335/6 |
| 4,223,365 | 9/1980 | Moran | 361/96 X |
| 4,382,270 | 5/1983 | Davidson et al. | 340/644 X |

Primary Examiner—Patrick R. Salce
Attorney, Agent, or Firm—Larry I. Golden; Richard T. Guttman; Norton Lesser

[57] ABSTRACT

Trip indicator electromagnets of the permanent magnet type for use in a high amperage molded case circuit breaker under control of the long time delay and the short time delay or instantaneous circuits respectively for indicating the nature of a fault current and which can be reset by operating a viewing window that renders the indicator visible in response to armature movement.

6 Claims, 4 Drawing Figures

TRIP INDICATOR ASSEMBLY FOR ELECTRONIC CIRCUIT BREAKER

FIELD OF THE INVENTION

This invention relates in general to circuit interruption apparatus employing electronic circuitry and more particularly to improved or more economical trip indicators for such apparatus.

SUMMARY OF THE PRIOR ART

Circuit breakers utilizing electronic devices offer advantages in the sensing and detection of different fault current conditions and enabling a breaker to respond to any of three types of fault current levels generally referred to as long time delay, short time delay and instantaneous trip levels. One example of a circuit breaker employing electronic devices to provide such functions is shown in U.S. Pat. No. 4,209,818.

The long time delay trip level corresponds to a range of moderate overload currents for which a time delay inversely related to $i^2$ is provided before the breaker is tripped. The short time delay trip level is related to higher fault level conditions wherefore it is desirable to trip the breaker after a shorter time delay then the long time delay trip period. The instantaneous trip level is chosen for those current levels at which it would be dangerous to allow the breaker to continue to pass current and therefore it is desirable to trip the breaker without any time delay.

In addition ground fault circuits are also employed in circuit breakers of the type described and in the aforementioned patent to sense ground fault currents and trip the breaker after a selected period of time.

In providing the various functions, electronic circuitry has been devised such as shown in copending application Ser. No. 493,115 filed by Zylstra and Ser. No. 492,516 filed by Zylstra and Jensen simultaneously herewith whose disclosures are incorporated herein, while in U.S. Pat. No. 4,215,328 a solenoid is disclosed utilizing a permanent magnet to hold the armature in an unoperated position against a spring bias until a temporary energizing current is applied to the coil to enable the spring to operate the armature.

The utilization of the circuitry shown in the aforementioned application and indicator solenoids utilizing a minimum of power as described in U.S. Pat. No. 4,215,328 to indicate respective ones of the aforementioned trip conditions is desirable and presents several problems since the solenoid condition must be visible and the armature must be reset somehow and preferably should not project from an associated panel.

SUMMARY OF THE INVENTION

In the present invention individual indicator solenoids are provided for respectively indicating a long time delay trip condition, either a short time delay or instantaneous trip condition and a ground fault trip condition.

The indicator solenoids may be of the type described in U.S. Pat. No. 4,215,328, for example, each controlled by a respective one of the fault detecting circuits and include permanent magnets which normally hold the respective armatures in an unoperated condition and after initial energization, the energizing current may be removed and the armatures held operated. An indicating block is secured to the armature and is visible through a viewing window in a control panel to provide an indication of the status of the respective fault circuit.

Resetting the deenergized solenoid is accomplished by simply reciprocating the viewing window to move the armature through the indicating block to the unoperated position in which the armature is held by the magnet. The viewing window then returns to normal under its own spring bias.

It is therefore an object of the present invention to provide an improved and more versatile circuit interruption indicating apparatus in a circuit breaker utilizing electronic circuitry.

Other objects and features of the present invention will become apparent on examination of the following Specification and Claims together with the Drawings.

DESCRIPTION OF THE PREFERRED EMBODIMENT

Figure 1:
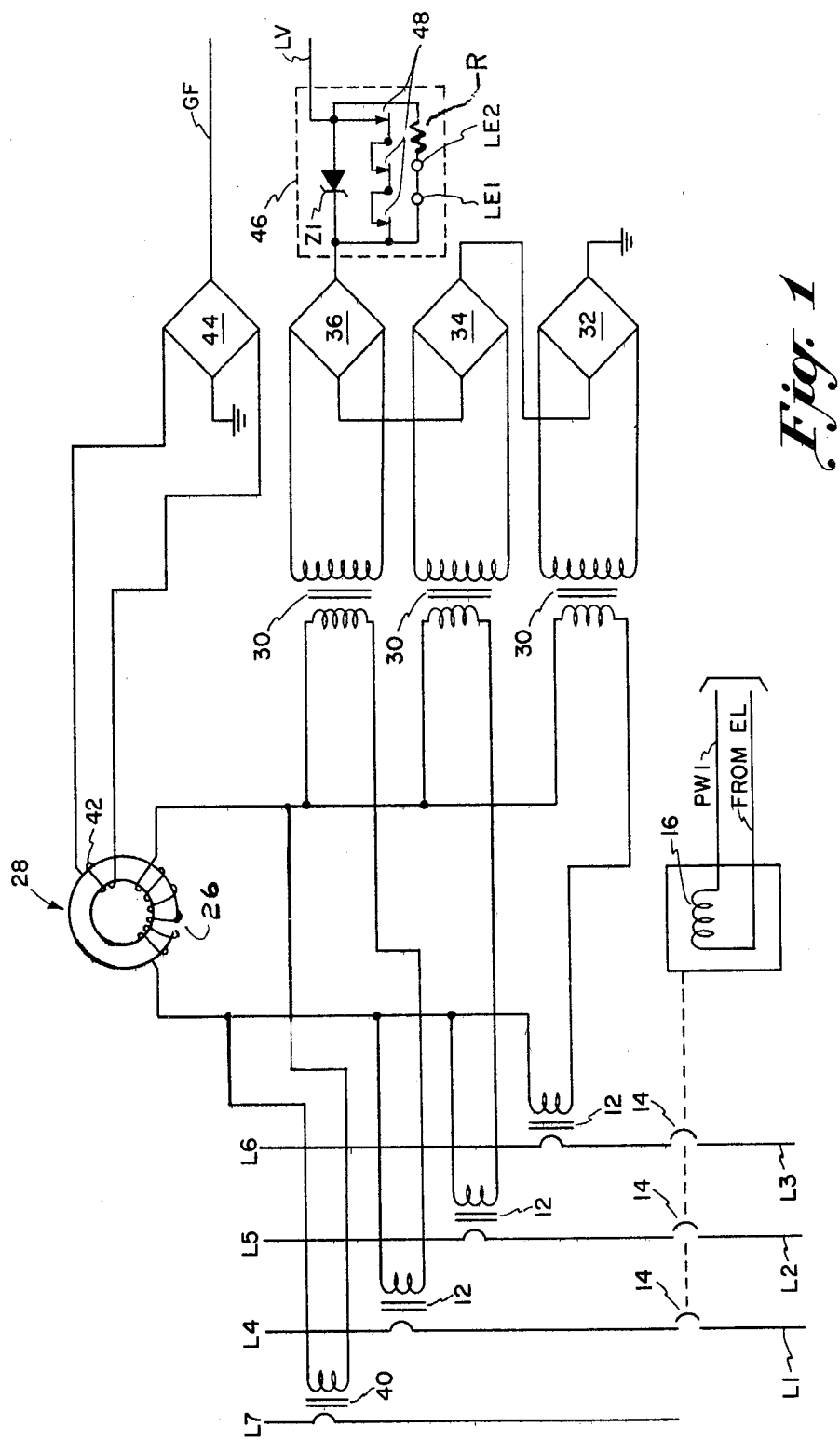
FIGS. 1 and 2 are largely block or schematic circuit diagrams illustrating the manner in which the circuit breaker and associated electronic control apparatus function.
Figure 2:
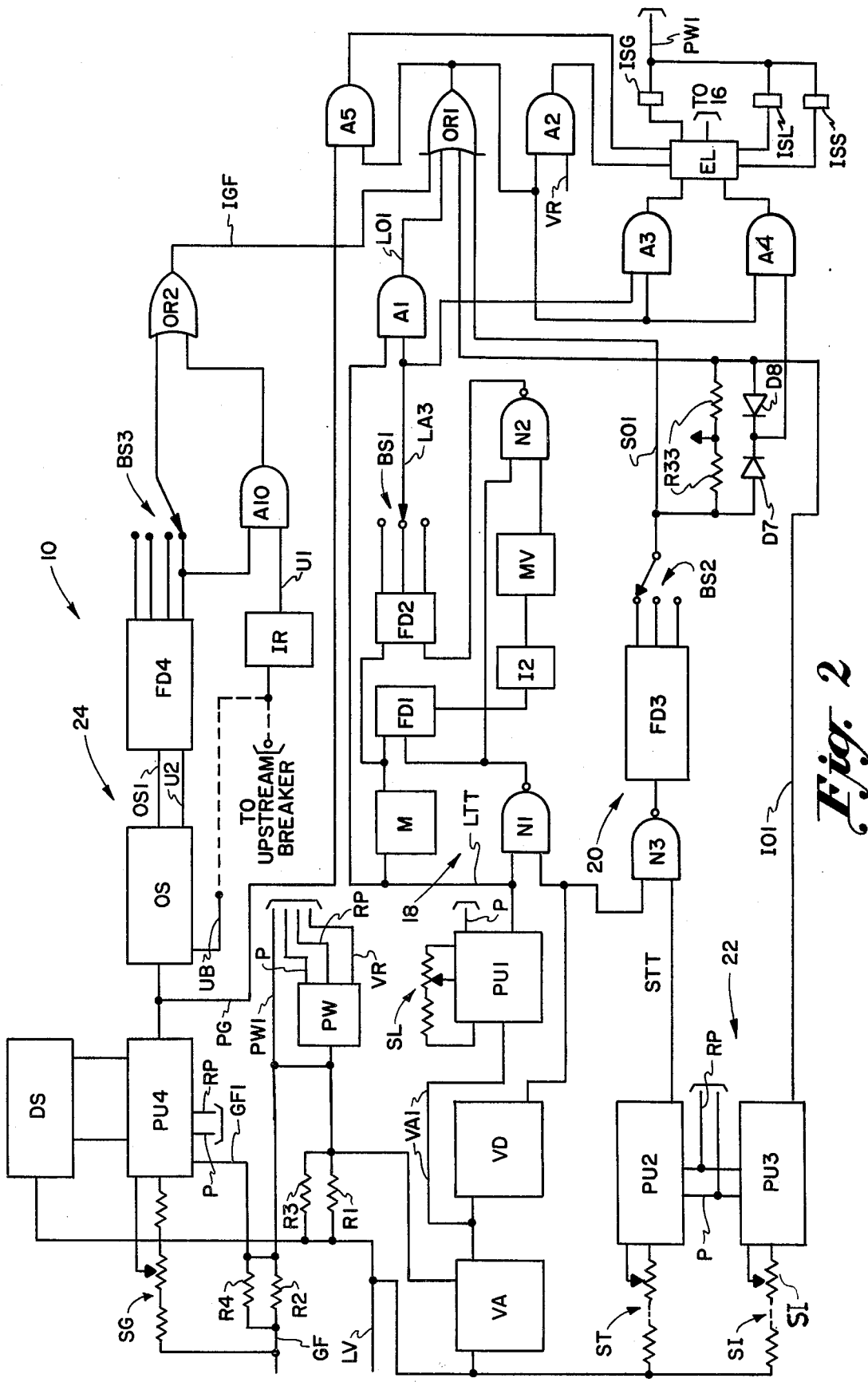

A block diagram of a circuit employing the principles of the present invention together with related apparatus is indicated in FIGS. 1 and 2 by the reference character 10. The circuit 10 is of the type shown in the aforementioned copending applications by Zylstra and is used in molded case three phase circuit breakers rated to carry currents in respective ratings or frame sizes of 800, 1200 or 3000 amps. An example of breakers of the described type are shown in simultaneously filed applications Ser. Nos. 492,905, 492,901 and 493,116 respectively filed by Chabot, Wong and Chabot, Wong and by Cook whose disclosures are incorporated herein. It is also adapted for use over an even more extensive range such as 250 amps and 4000 amp breaker frame size.

Current is extended by a breaker from three phase or line conductors L1, L2 and L3 to respective lead conductors L4, L5 and L6 with the connections forming the primaries of respective conventional current sensing transformers 12, after passing through respective circuit breaker contacts 14. In addition a fourth conductor or a ground bar indicated at L7 may be employed with the breaker as an additional ground in a conventional manner and provided with a current sensing transformer.

The contacts 14 are adapted to be opened by a trip solenoid 16, energized to interrupt the passage of current from the line conductors L1–L3 to the load conductors and may be either a conventional solenoid or of a type described in U.S. Pat. Nos. 4,213,165; 4,208,689; 4,209,817 and 4,215,328. The trip solenoid 16 is energized for opening contacts 14 under control of either a long time delay circuit 18, a short time delay circuit 20, an instantaneous circuit 22 or a ground fault circuit 24.

One terminal of each current transformer 12 is connected to the same terminal of a winding 26 of a differential ground fault summing transformer 28 and the other terminal of each current transformer is connected to one terminal of a respective primary of a respective step up transformer 30. The other terminal of each primary of each step up transformer is connected to the other terminal of the ground fault transformer winding 26. The secondary of each step up transformer 30 is connected to a respective diode or rectifier bridge 32, 34 and 36.

If the ground bar L7 is used, a transformer 40 associated with the ground bar is also connected to winding 26 of ground fault summing transformer 28. The output of transformer 28 is provided by a winding 42 and applied to a respective ground fault rectifier bridge 44.

Bridges 32, 34 and 36 are connected in series with one output terminal extending from bridge 32 to ground and the other output terminal extending from bridge 36 through a plurality of optionally connected serially arranged thermal or bimetal sensing switches indicated by block 46 in FIG. 1 to a common input signal lead LV. Lead LV provides an input to a power PW, an amplifying circuit VA shown in FIG. 2; to a desensitizing circuit DS in the ground fault circuit 24, and to switches ST and SI respectively controlling the short time delay and instantaneous circuits 20 and 22. Lead LV thus provides a rectified pulsating positive D.C. signal corresponding to the peak current or line voltage carried by the line conductors L1–L3.

The thermal switches 48 as shown in FIG. 1 are connected in series between the output of bridges 32–36 and lead LV and each is located preferably adjacent a respective pair of breaker contacts 14 or on a respective one of the circuit breaker terminals as shown in the aforementioned simultaneously filed applications. At least three switches 48 are provided so that there is one thermal switch for each conductor or phase. The switches 48 each preferably comprises a bimetal controlling a pair of contacts, which are opened by the respective bimetal, if the associated contact or terminal temperature rises above a predetermined value to open the respective switch 48.

A pair of serially connected light emitting signal diodes LE1 and LE2 and an associated serially connected resistor R are connected in shunt with all of the switches 48 and a zener diode Z1 is connected in shunt with all of the switches 48 and the diodes LE1 and LE2.

If one of the switches 48 should open due to the adjacent contacts or terminal heating to a temperature above a selected or predetermined value, a voltage drop is developed across the diodes LE1 and LE2, which are located at the control panel of the breaker. The diodes LE1 and LE2 therefore light to signal the overheated temperature condition. The zener diode Z1 prevents the voltage across the diodes LE1 and LE2 and resistor R from rising above a selected value that would render the diodes LE1 and LE2 inoperable.

The ground fault diode bridge 44 has one output terminal connected to ground and the other output terminal provides a positive signal over a signal lead GF to a respective switch SG in the ground fault circuit 24 when the current induced in winding 42 does not sum to zero.

The power supply PW receives its input from lead LV and GF through a respective one of a pair of low value 68 ohm and 100 ohm respective burden resistors R1 and R2. The positive potential provided on lead LV or GF is applied to lead PW1 extending to one terminal of the trip solenoid 16, indicator solenoids ISL, ISS and ISG and to power supply PW.

A respective rating resistor R3 is connected in shunt with resistor R1 and a respective rating resistor R4 is connected in shunt with resistor R2. Rating resistors R3 and R4 are carried by a rating plug in the circuit breaker control panel and may thus be easily changed, as the control panel is conventionally accessible. By selection of the resistance value of the rating plug resistors R3 and R4 the potential provided on signal leads LV and GF may be controlled to provide the same potential irrespective of the current rating of the breaker to thus enable the remaining circuitry to be standardized for the mentioned breaker ratings.

Each of the circuits 18, 20, 22 and 24 includes a respective pick up circuit PU1, PU2, PU3 and PU4 under control of a respective switch SL, ST, SI and SG respectively. The switches SL, ST, SI and SG each comprises a respective plurality of serially connected resistors of which none or a selected number are adapted to be conventionally shunted by a respective switchblade.

Figure 3:
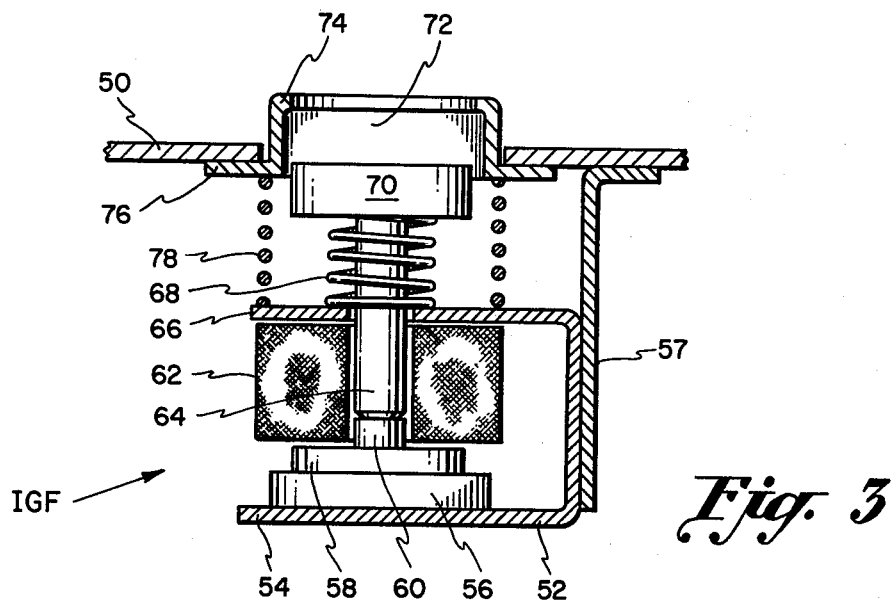
FIG. 3 illustrates one of the indicator solenoids in unoperated condition.
Figure 4:
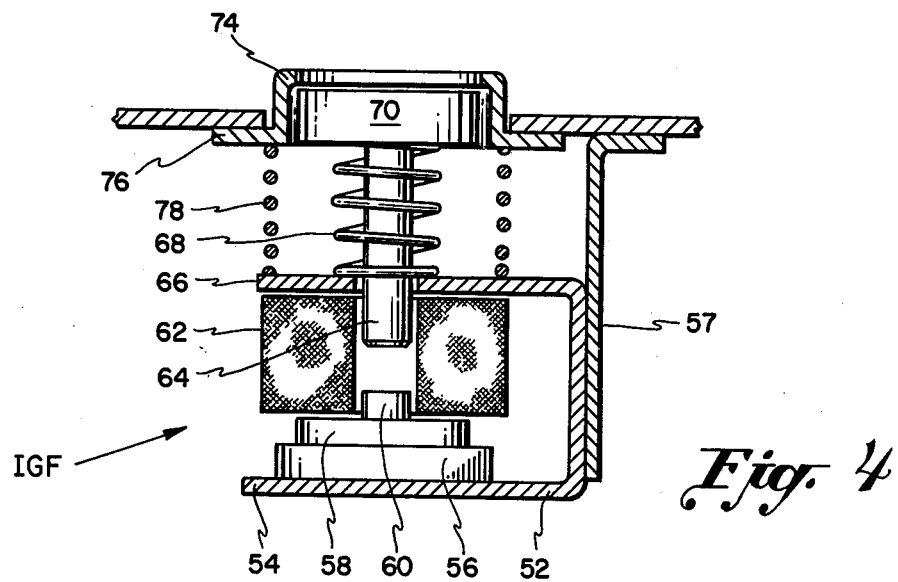
FIG. 4 illustrates the solenoid shown in FIG. 3 in the operated condition.

The switches are all mounted on the circuit breaker control panel a portion of which is shown at 50 in FIGS. 3 and 4 and is located for facile access thereto. Switches SL, ST, SI, and SG for the long time delay circuit 18, the short time delay circuit 22, the instantaneous circuit 24 and the ground fault circuit 26 respectively control the pickup value at which the respective circuit initiates operation as a desired proportion of the breaker's rating.

In addition the circuit breaker panel includes a band switch BS1 for the long time delay circuit 18, a band switch BS2 for the short time delay circuit 20 and a band switch BS3 for ground fault circuit 24 respectively to select a count proportional to time in which the respective circuit operates the trip solenoid 16 and a respective indicator solenoid ISL, ISS or ISG under control of the electronic switches indicated by box EL in response to a respective fault condition. The selections available by means of the band switches BS1 and BS2 for the circuits 18 and 20 are chosen at maximum, intermediate and minimum and each represents a selected proportion of a constant K (or count) multiplied by a selected percent of rated current. The band switch BS3 provides absolute time delays selectable in 0.1 second intervals ranging from 0.1 second to 0.5 seconds.

The circuit 18 includes a pair of frequency dividers FD1 and FD2 in addition to the pickup circuit PU1. Circuit PU1 operates under control of circuit VA, which transmits a signal over lead VA1 to pick up circuit PU1 and a voltage to frequency converter VD. When the signal level on lead LV rises above a predetermined level chosen between 0.5X and 10X where X=nominal breaker current, circuit PU1 then supplies an output on lead LTT to a memory M, which resets dividers FD1 and FD2. Divider FD1 is thereafter supplied with pulses from circuit VD at a frequency corresponding to the voltage on lead LV through a first nand gate N1 under control of circuit PU1.

An output from divider FD1 is derived when the counter has counted a predetermined number of pulses to in turn control a monostable multivibrator MV which in turn controls a second nand gate N2 in conjunction with the pulses derived from gate N1 to step the second divider FD2. Divider FD1 thus periodically controls the multivibrator MV to periodically open gate N2 and enable circuit VD to pulse counter FD2. When divider FD2 reaches a count corresponding to the setting of switch BS1 or $i^2t=K$, the output is applied to and gates A1. Gate A1 which also received an output from pick up circuit PU1 over lead LTT, opens to transmit an output over lead LO1.

The output on lead LO1 is transmitted through an OR gate OR1 for opening an and gate A2 and operating a respective electronic switch incorporated in box EL and the trip solenoid 16. Trip solenoid 16 opens the breaker contacts 14, which interrupts the current through the breaker. Simultaneously the output from FD2 is also applied over lead LA3 to an and gate A3, which also receives the output from gate OR1 for operating a respective electronic switch incorporated in box EL and the respective indicator solenoid ISL. Solenoid ISL is located on the control panel of the breaker and indicates that the tripping is due to the functioning of the Long Time Delay Circuit 18.

The short time delay circuit 20 includes a frequency divider FD3 in addition to circuit PU2. Circuit PU12 receives its input from lead LV and switch ST and when the voltage on lead LV rises above a value determined by the setting of switch S1 chosen between 2X and 8X, circuit PU2 controls nand gate N3 over lead STT to enable divider FD3 to be pulsed or advanced from the circuit VD.

When the divider FD3 reaches a predetermined count corresponding to the setting of band switch BS2, an output is passed to OR gate OR1 over lead SO1 and to gate A4. Gate OR1 passes the signal to gate A1 for operating the trip solenoid 16 to open the contacts 14. Simultaneously and gate A4 is opened by the signal on lead SO1 and the signal from gate OR1 to control an electronic switch incorporated in box EL for operating an indicator solenoid ISS on the control panel in a time related to the first power of the current.

Solenoid ISS on operation indicates either the short time delay circuit 20 or the instantaneous circuit 22 have detected currents of respective magnitude. It will be understood that while both circuits 20 and 22 may be provided in a single breaker, the customer at his option may prefer to use only one of the two circuits, however if it is desired to utilize both circuits separate electronic switches and indicator solenoids may be provided therefore in an obvious manner.

The instantaneous circuit 22 includes the pickup circuit PU3 which also receives an input from lead LV and switch SI to furnish an output over lead IO1 when the voltage on lead LV reaches a value chosen between 2X and 10X where X is the nominal rated breaker current. The signal on lead IO1 is transmitted to both gate OR1 and gate A4. Gate OR1 passes this output to both gates A2 and A4 to operate solenoids 16 and ISS respectively, which respectively open the breaker contacts and indicate the nature of the fault. Solenoid ISS operates as for example explained in the copending application to Zylstra and Venzke to provide the trip indication.

The ground fault circuit 24 includes a 200 KH oscillator OS and a counter or divider FD4 in addition to the pickup circuit PU4 and the desensitization circuit DS. Circuit PU4 receives an input from lead GF and switch SG and initiates operation of oscillator OS, when the ground fault current reaches a level chosen between 20%-75% of nominal breaker current at 1600 amps and between 20%-40% of nominal breaker current at 3000 amps in accord with the setting of switch SG.

Circuit DS receives an input from lead LV. In the event the signal on lead LV is over a predetermined level indicating the ground fault signal results from transformer saturation giving rise to a ground fault ringing current in response to initiation of current flow from the conductors L1-L3, circuit DS inhibits operation of circuit PU4. This prevents pulse frequency divider FD4 from receiving an input over lead OS1 and advancing the divider as long as the ground fault signal is below a selected level.

In the event circuit PU4 is not inhibited it controls oscillator OS to pulse frequency divider FD4 overload OS1 to advance the divider.

The output of the divider is applied to a plurality of gates which are selected in accordance with the setting of band switch BS3 to provide an output corresponding to any one of four time periods ranging from 0.2 to 0.5 seconds in 0.1 second increments or switch BS3 is set directly to one output of the divider which supplies a 0.1 second output directly to the switch. Additionally an output from divider FD4 is applied after 0.1 second to and gate A10, which would normally furnish an output, unless its other input is inhibited or restrained.

The output from switch BS3 is applied to an OR gate OR2 which passes the output to gate OR1 over lead IGF. Gate OR1 opens gate A2 to operate solenoid 16 and gate OR1 also provides an output to gate A5. Gate A5 also receives an output from circuit PU4 over lead PG and gate A5 opens to energize an electronic switch EL4 incorporated in box EL to and energize the ground fault indicator solenoid ISG, which indicates the ground fault condition.

In addition the ground fault circuit 24 includes a restraint circuit IR. The restraint circuit IR is utilized in the event the breaker is the only one of its type in the system or is an upstream breaker in a system of similar breakers including downstream breakers. In the case of a momentary ground fault condition, it is desirable for the downstream breaker at which the fault occurs to clear the fault before the upstream breaker trips so that if the present breaker is used as a downstream breaker or is the only breaker of its type in the system, its ground fault signaling is used to prevent gate OR2 at the upstream breaker or its own ground fault signal.

Thus the output from circuit PU4 on lead PG, is connected through lead UB indicated by dashed lines to the restraint circuit IR in the upstream breaker or in the respective breaker. The signal on lead UB controls circuit IR to inhibit gate A10 in the upstream breaker over lead U1 or in the present breaker, if lead UB is connected to its own restraint circuit to permit the ground fault signal at that breaker to operate counter FD4 for a desired period. At the upstream breaker the connection of the output of circuit PU4 at that breaker to lead UB is omitted and instead lead UB from the downstream breaker is connected directly to circuit IR. That breaker must receive a ground fault signal of sufficient duration to step counter FD4 to the position corresponding to the setting of switch BS3 in order to operate solenoids 16 and ISG at that breaker.

If the breaker is a downstream breaker in a system of similar breakers, lead UB to the respective restraint circuit IR may be unconnected and when a signal from the circuit PU4 is applied to oscillator OS, the counter or divider FD4 supplies an output on counting to 0.1 second to open and gate A10. Gate A10 passes an output pulse to gates OR2 and OR1 in sequence for operating the trip and indicator solenoids 16 and ISG respectively at that breaker. Solenoid ISG is likewise located on the control panel.

In FIG. 3 one of the indicator solenoids IGF identical to the other indicator solenoids ISL and ISF is shown. Solenoid IGF comprises a U shaped heelpiece or yoke 52 having one leg 54 on which a permanent magnet 56 is mounted. The back leg of U shaped heelpiece may be secured to a mounting bracket 57 to position the solenoid adjacent the panel.

The magnet 56 has its south pole adjacent leg 54 and a collector or flux concentrator 58 is located adjacent the north pole of the magnet. Collector 58 has a central projection 60 extending into the cylindrical passage of an annular coil 62 having one terminal connected to lead PW1 and the other to the respective electronic switch indicated by box EL for energization as explained in the aforementioned copending application.

The cylindrical passage receives an armature 64 extending through a passage in the other leg 66 of the heelpiece. One end of the armature is located adjacent projection 60 and is biased therefrom by a coil or helical spring 68 captured between the leg 66 and an indicating block 70 of larger diameter than the armature.

Indicating block 70 is received in a recess 72 of a window 74 of transparent material having a frosted surface through which indicia the adjacent face of the indicating block may not be read unless the block is adjacent the window, although the block may be seen.

The window 74 has flange means 76 seated against the rear surface of panel 50 in response to the bias of a coil or helical spring 78 seated between the flange means 76 and the leg 66.

Normally or in the unenergized state the armature 64 has one end seated against the flux collector and the permanent magnet 56 provides sufficient force to hold the armature in that position against the bias of spring 68. The indicating block 70 is therefore spaced from the window 74, where its indicia cannot be read through the frosted portion of the window.

In response to energization of the coil 62, a field opposing the field of the magnet is generated and the spring 68 moves the indicating block 70 into the recess 72 and adjacent window 74 permitting the indicia to be read and the position of the block detected for indicating the reason for tripping of the breaker.

Thereafter assuming the fault situation is cleared and it is desired to reset the solenoid IGF, pressure is simply applied against window 74 to move the window against the bias of spring 78 and the indicating block 70 and armature 68 against the bias of spring 68. Movement continues until the armature engages the flux collector 58, whereafter the window may be released. Release of the window returns the flange means 76 to engage panel 50 under the bias of spring 78 however the indicating block 70 and armature 64 are retained in their unoperated condition against the bias of spring 68 by the magnet 56.

The foregoing is a description of an improved trip indicator solenoid assembly for electronically controlled breaker whose inventive concepts are believed set forth in the accompanying claims.

We claim:

1. A trip indicator assembly corresponding to a predetermined type of fault current for use in a circuit breaker having interruption means operable for interrupting a plurality of line conductors and including detecting means for detecting any one of a plurality of different type of fault current one of which corresponds to said indicator and for operating said interrupting means to interrupt said line conductors, the improvement comprising,
    a coil energized by said detecting means in response to the detection of a fault current corresponding to said predetermined type,
    an armature for said coil movable between a normal position and an operated position,
    a permanent magnet for retaining said armature in said normal position in response to movement of said armature from said operated position to said normal position,
    a spring biasing said armature for movement from said normal position to said operated position and effective in response to energization of said coil for moving said armature to said operated position,
    an indicator carried by said armature,
    a movable viewing window rendering said indicator visible in response to movement of said armature to said operated position, said window movable in one direction to move said armature to said normal position for enabling said magnet to retain said armature in said normal position,
    and bias means biasing said viewing window opposite said one direction to a position in which said indicator is visible in response to movement of said armature to said operated position.

2. In the trip indicator claimed in claim 1, a U-shaped heelpiece with said coil located between the side legs of said heelpiece and said magnet located between one side leg and said coil, and a passage in the other side leg for receiving said armature, and said spring located between said other leg and said indicator.

3. For use with the trip indicator claimed in claim 2, a panel, and flange means on said window engaging said panel in response to movement of said window in said opposite direction by said bias means.

4. The trip indicator claimed in claim 3 in which said bias means comprises a coil spring positioned between the other leg of said heelpiece and said flange means.

5. The trip indicator claimed in claim 4 in which said indicator includes a block carried by said armature and said window has a recess receiving said block in response to movement of said armature to said operated position and the wall of said recess is frosted and said panel has an opening for receiving said window.

6. The trip indicator claimed in claim 5 in which the edge of said panel opening and said block serve as guide means for said window.

* * * * *